United States Patent [19]

Kobayashi et al.

[11] Patent Number: 5,053,671
[45] Date of Patent: Oct. 1, 1991

[54] PIEZOELECTRIC SENSOR FOR MONITORING KINETIC MOMENTUM

[75] Inventors: Hiroshi Kobayashi; Kenichi Tanaka, both of Kanagawa, Japan

[73] Assignee: Nissan Motor Company, Limited, Yokohama, Japan

[21] Appl. No.: 120,964

[22] Filed: Nov. 16, 1987

[51] Int. Cl.$^5$ .............................................. H01L 41/08
[52] U.S. Cl. ................................. 310/329; 310/324; 310/344; 310/345
[58] Field of Search ............... 310/321, 323, 324, 328, 310/329, 338, 339, 345, 346, 344; 73/517 R

[56] References Cited

U.S. PATENT DOCUMENTS

| | | |
|---|---|---|
| 3,137,836 | 6/1964 | Glover .......................... 310/345 X |
| 3,241,373 | 3/1966 | Ricketts et al. ................ 310/329 X |
| 3,331,970 | 7/1967 | Dundon et al. ................. 310/324 |
| 3,360,664 | 12/1967 | Staube ........................... 310/337 X |
| 3,453,458 | 7/1969 | Curran et al. .................. 310/344 |
| 3,688,251 | 8/1972 | Morris ........................... 310/329 X |
| 3,749,948 | 7/1973 | Morris ........................... 310/329 X |
| 3,827,538 | 8/1974 | Morgan .......................... 310/329 |
| 3,873,123 | 3/1975 | Joneleit ......................... 310/329 |
| 3,911,388 | 10/1975 | Crump et al. .................. 310/329 X |
| 3,945,664 | 3/1976 | Hiruma ......................... 310/329 |
| 3,992,039 | 11/1976 | Hiruma ......................... 310/329 |
| 4,017,099 | 4/1977 | Hegel et al. ................... 310/329 |
| 4,054,295 | 10/1977 | Elliott ........................... 310/329 |
| 4,084,667 | 4/1978 | Kurrat . | |
| 4,105,216 | 8/1978 | Graham et al. ................ 310/329 |
| 4,145,073 | 3/1979 | McLuckie et al. ............. 310/329 |
| 4,162,083 | 7/1979 | Zabler et al. .................. 310/329 |
| 4,164,664 | 8/1979 | Kasiewicz ..................... 310/329 |
| 4,185,845 | 1/1980 | Misch et al. ................... 310/329 |
| 4,266,790 | 5/1981 | Uemura et al. ................ 310/329 |
| 4,310,172 | 1/1982 | Claude et al. .................. 310/329 |
| 4,313,529 | 2/1982 | Kato et al. ..................... 310/329 |
| 4,323,266 | 4/1982 | Savage .......................... 310/329 |
| 4,327,936 | 5/1982 | Sekiguchi ...................... 310/329 |
| 4,364,259 | 12/1982 | Muranaka et al. ............. 310/329 X |
| 4,377,293 | 3/1983 | Senoo ............................ 310/329 |
| 4,382,603 | 5/1983 | Senoo ............................ 310/329 |
| 4,390,187 | 6/1983 | Maeda ........................... 310/329 |
| 4,395,908 | 8/1983 | Shopland ....................... 310/329 X |
| 4,401,310 | 8/1983 | Ishikawa et al. ............... 310/329 |
| 4,436,318 | 3/1984 | Ichikawa et al. ............... 310/329 |
| 4,462,610 | 7/1984 | Saito et al. ..................... 310/329 |
| 4,463,839 | 8/1984 | Ashiba .......................... 310/329 |
| 4,466,625 | 8/1984 | Kondo et al. .................. 310/329 |
| 4,468,739 | 8/1984 | Woods et al. .................. 310/329 |
| 4,507,583 | 3/1985 | Jensen et al. .................. 310/324 X |
| 4,519,169 | 5/1985 | Smith ............................ 310/329 |
| 4,537,411 | 8/1985 | Naramoto ...................... 310/329 |
| 4,579,366 | 4/1986 | Doi et al. ....................... 310/329 |
| 4,586,728 | 5/1986 | Tokunaga et al. .............. 310/329 |
| 4,595,072 | 6/1986 | Barnea .......................... 310/329 |
| 4,603,316 | 7/1986 | Kobayashi et al. ............. 310/324 X |
| 4,616,163 | 10/1986 | Kanai et al. .................... 310/329 |

(List continued on next page.)

FOREIGN PATENT DOCUMENTS

| | | |
|---|---|---|
| 0100501 | 7/1983 | European Pat. Off. . |
| 909257 | 7/1949 | Fed. Rep. of Germany ...... 310/329 |
| 59-23223 | 6/1984 | Japan . |
| 0705642 | 12/1979 | U.S.S.R. ............................. 310/321 |
| 2084692 | 4/1982 | United Kingdom . |

Primary Examiner—Mark O. Budd
Attorney, Agent, or Firm—Foley & Lardner

[57] ABSTRACT

A piezoelectric kinetic momentum sensor employs a thin oscillable diaphragm member on which a thin plate form piezoelectric sensor element is mounted. The entire circumferential edge of the oscillable diaphragm member is supported by the sensor casing. To avoid fluctuation of sensitivity due to the exerting direction of kinetic energy, the diaphragm member and the piezoelectric sensor element are formed in a coaxial thin disc shaped configuration, in the preferred construction. In the further preferred construction, the sensor casing is composed of two seperable bottomed cylindrical components, each of whcih has its circumferential cylindrical wall section free edge mating with the other. The circumferential edge of the diaphragm member is sandwiched between the mating free edges of the cylindrical components to define a sealed and enclosed internal space within the sensor casing.

27 Claims, 3 Drawing Sheets

U.S. PATENT DOCUMENTS

| | | | |
|---|---|---|---|
| 4,616,848 | 10/1986 | Sugasawa et al. | 310/329 |
| 4,621,832 | 11/1986 | Nakashima et al. | 310/329 |
| 4,624,477 | 11/1986 | Kumagai et al. | 310/329 |
| 4,641,054 | 2/1987 | Takahata et al. | 310/324 |
| 4,647,069 | 3/1987 | Iijima | 310/329 |
| 4,651,290 | 3/1987 | Masaki et al. | 310/329 |
| 4,657,280 | 4/1987 | Ohmori | 310/329 |
| 4,658,650 | 4/1987 | Yorinaga et al. | 310/329 X |
| 4,659,104 | 4/1987 | Tanaka et al. | 310/329 |
| 4,669,749 | 6/1987 | Tanaka et al. | 310/329 |
| 4,696,489 | 9/1987 | Fujishiro et al. | 310/329 |
| 4,705,981 | 11/1987 | Inoue et al. | 310/324 |
| 4,718,695 | 1/1988 | Kawagoe | 310/329 |

PIEZOELECTRIC SENSOR FOR MONITORING KINETIC MOMENTUM

BACKGROUND OF THE INVENTION

1. Field of the Invention

The present invention relates generally to a piezoelectric sensor for monitoring kinetic momentum of movable mechanical constructions. More specifically, the invention relates to a piezoelectric-type momentum sensor suitable to use as an accelerometer, such as that employed for an automotive control system. Further the invention relates to a piezoelectric sensor specifically adapted for monitoring relative displacement between a vehicle body and a wheel axel in an automotive suspension system.

2. Description of the Background Art

The U.S. Pat. No. 4,696,489, issued on Sept. 27, 1987, to Takeshi FUJISHIRO et al, and assigned to the common assignee of the present invention discloses an automotive suspension control system in which an accelerometer is incorporated for monitoring vertical acceleration of the vehicle body. The monitored vertical acceleration of the vehicle body is utilized as one of the control parameters in controlling damping characteristics of the vehicular suspension system. In the construction shown in the aforementioned U.S. Patent, the accelerometer employs an inertial member causing deformation of a resiliently deformable member and a strain gauge for detecting deformation magnitude and speed and whereby detecting the vertical acceleration of the vibrating vehicle body. This type of accelerometer may be replaced with a piezoelectric-type accelerometer for performing the same or similar acceleration monitoring operation.

One of the typical constructions of piezoelectric-type accelerometers which employ a piezoelectric element as a sensor element, has been disclosed in the Japanese Patent First (unexamined) Publication (Tokkai) Showa 59-23223, for example. This conventional piezoelectric accelerometer employs a piezoelectric sensor element supported in a housing in cantilever fashion. In this construction, the piezoelectric sensor element may vibrate about the one supported end when vibration energy is exerted. This causes the concentration of distortion stress around the supported end and results in fatigue or uneven exhaustion. Therefore, such concentrated stress may make it difficult to stably maintain reasonable performance and may shorten the life of the accelerometer.

In addition, when the supporting structure, supporting the, piezoelectric sensor element, is asymmetric in construction, the sensitivity of the sensor element tends to be fluctuate depending upon the exerting direction of the vibration energy. In order to avoid this, it has been required that the conventional cantilever type piezoelectric sensor element supporting structure be precisely symmetric in construction. This requires high accuracy machining, such as by of laser machining apparatus. Such high accuracy machining requires substantial cost.

SUMMARY OF THE INVENTION

Therefore, it is a principle object of the present invention to provide a piezoelectric-type kinetic momentum sensor which can solve the problem in the prior art set forth above.

Another object of the present invention is to provide a piezoelectric electric acceleration sensor which does not require precisely symmetric supporting structure for the piezoelectric sensor element.

A further object of the invention is to provide a piezoelectric accelerometer which does not have the deficiencies resulting from a cantilever fashion piezoelectric sensor element supporting structure.

A still further object of the invention is to provide a piezoelectric accelerometer which is specifically adapted to be employed in an automotive suspension control system.

A yet further object of the invention is to provide a piezoelectric accelerometer which is designed to detect a predetermined frequency range of acceleration.

In order to accomplish the aforementioned and other objects, a piezoelectric kinetic momentum sensor, according to the present invention, employs a thin oscillable diaphragm member on which a thin plate form piezoelectric sensor element is mounted. The overall circumferential edge of the oscillable diaphragm member is supported on a sensor casing.

To avoid fluctuation of sensitivity due to the exerting direction of kinetic energy, the diaphragm member and the piezoelectric sensor element are formed in a coaxial thin disc shaped configuration, in the preferred construction. In the further preferred construction, the sensor casing is composed of two separable bottomed cylindrical components, each of which has its circumferential cylindrical wall section free edge mating with the other. The circumferential edge of the diaphragm member is sandwiched between the mating free edges of the cylindrical components to define a sealed and enclosed internal space within the sensor casing.

According to one aspect of the invention, a piezoelectric sensor for monitoring kinetic momentum of a movable member, comprises a sensor casing defining an enclosed internal space therein, a piezoelectric sensor assembly composed of a flexible plate member having at least one plane surface and a piezoelectric element fitted onto the plane surface of the flexible plate member, and a sensor support member secured onto the inner periphery of a circumferential wall of the sensor casing and engaging circumferential edge of the piezoelectric sensor assembly so as to oscillably support the latter within the enclosed internal space of the sensor casing.

According to another aspect of the invention, a piezoelectric sensor for monitoring the kinetic momentum of a movable member, comprises a sensor casing made of insulating material and defining an enclosed internal o space of circular cross section, a piezoelectric sensor assembly composed of a disc-shaped flexible plate member having at least one plane surface and a disc-shaped piezoelectric element fitted onto the plane surface of the flexible plate member, and a sensor support member secured onto the inner periphery of a circumferential wall of the sensor casing and engaging the entire circumferential edge of the piezoelectric sensor assembly so as to oscillably support the latter within the enclosed internal space of the sensor casing.

According to a further aspect of the invention, a piezoelectric, accelerometer for monitoring acceleration of a vibrating member, comprises a sensor casing including separate first and second components which have circular edge sections, in which the first and second components are made of insulating material and are assembled to each other with sealed secured mating edges, the sensor casing defining an enclosed internal space of circular cross section, a piezoelectric sensor assembly composed of a disc-shaped flexible plate member made of an electrically conductive material and having at least one plane surface and a disc-shaped piezoelectric element fitted onto the plane surface of the flexible plate member, and a sensor support member made of an elastic material and secured onto the inner periphery of a circumferential wall of the sensor casing and engaging the entire circumferential edge of the piezoelectric sensor assembly so as to oscillably support the latter within the enclosed internal space of the sensor casing.

The sensor support member is made of an elastic material. The sensor support member is interposed between the first and second components and secured thereto for establishing an air-tight seal therebetween. The piezoelectric sensor assembly has its circumferential edge firmly engaging the sensor support member.

On the other hand, the first and second components are formed into bottomed cylindrical configuration to define the enclosed internal space of a circular cross-section, and the flexible plate member and the piezoelectric elements are formed into disc-shaped configurations, the flexible plate member having a diameter essentially conforming or slightly greater than the internal diameter of the circular internal space of the sensor casing. The first and second components of the sensor casing defines a recess for receiving the sensor support member on the inner periphery.

In the preferred construction, the disc-shaped piezoelectric element has a smaller diameter than that of the flexible plate member.

The flexible plate member may be made of a material which has a thermal expansion rate approximately the same as the thermal expansion rate of the piezoelectric element.

The piezoelectric sensor may further comprise means for equalizing pressure in chambers defined in the internal space of the sensor casing and separated by the piezoelectric sensor assembly. In the preferred construction, the pressure equalizing means comprises a through opening formed through the flexible plate member.

The sensor casing also receives a sensor circuit assembly within the enclosed internal space adjacent the piezoelectric sensor assembly. The sensor circuit assembly is so located as to be close enough to the piezoelectric sensor assembly so that the piezoelectric element of the piezoelectric sensor assembly can be connected to the sensor circuit by means of a short lead wire. The sensor circuit assembly comprises a circuit board and a plurality of sensor circuit components including an amplifier element and a filter element and is buried by a potting material.

DESCRIPTION OF THE PREFERRED EMBODIMENT

Figure 1:
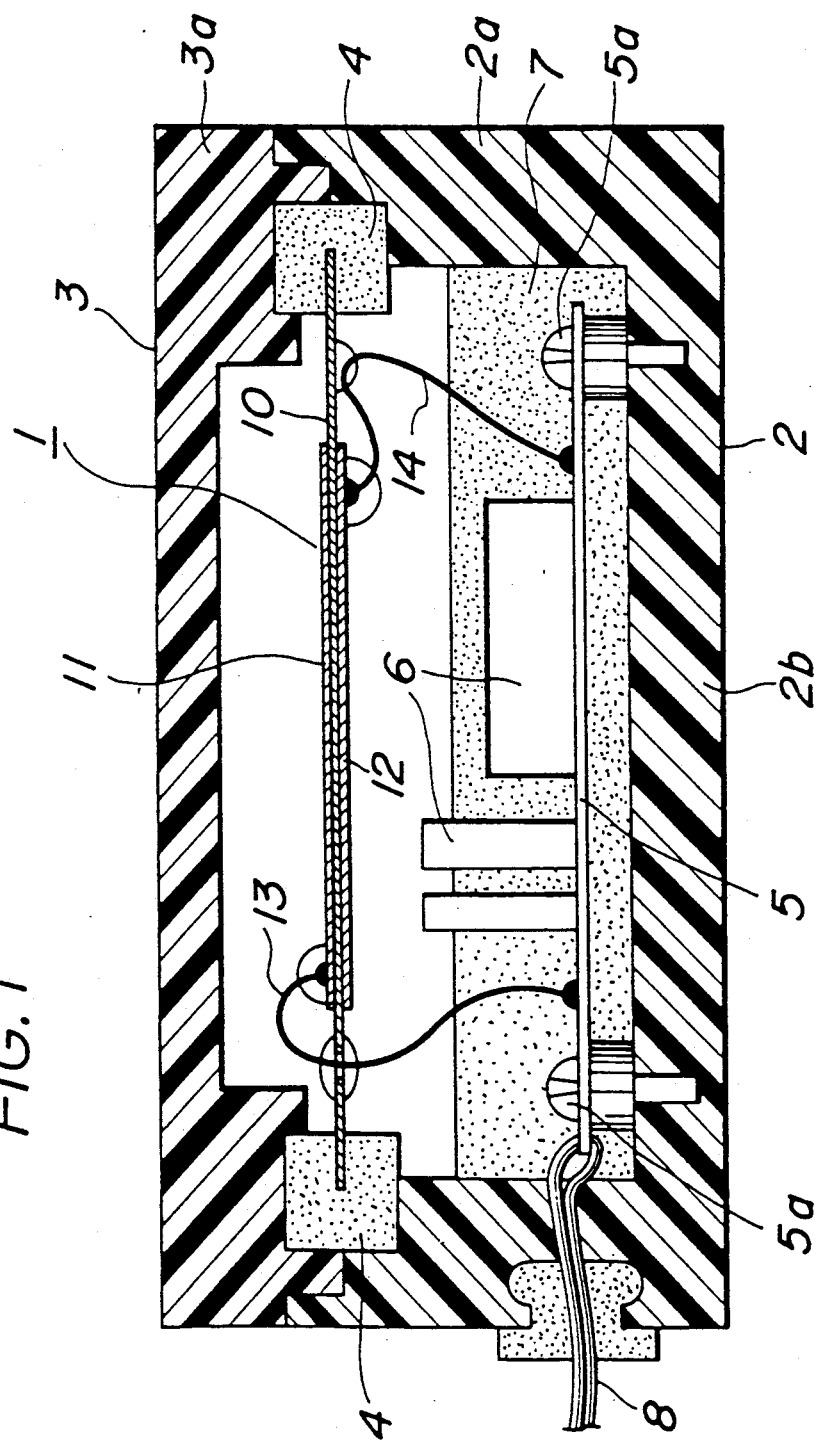
FIG. 1 is a section of the preferred embodiment of a piezoelectric kinetic momentum sensor assembly according to the present invention.
Figure 2:
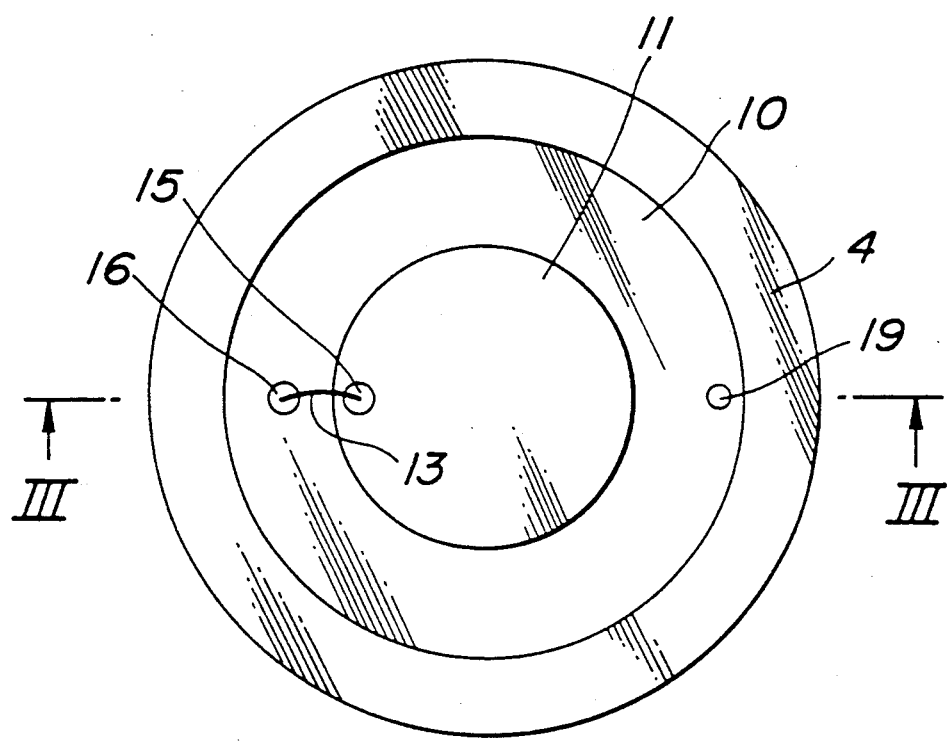
FIG. 2 is a plan view of a piezoelectric sensor to be employed in the piezoelectric kinetic momentum sensor assembly of FIG. 1.
Figure 3:
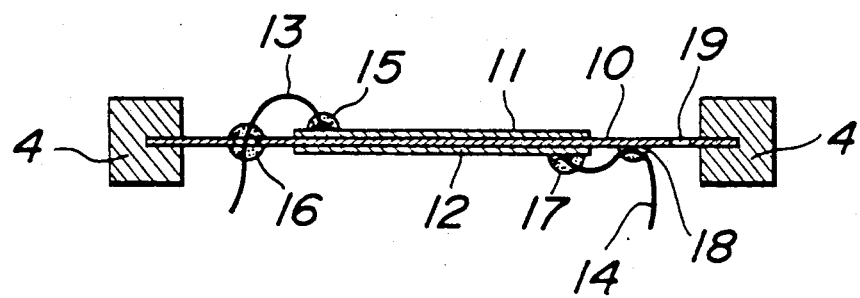
FIG. 3 is a section of the piezoelectric sensor taken along line III—III of FIG. 2.

Referring now to the drawings, particularly to FIGS. 1 through 3, the preferred embodiment of a piezoelectric kinetic momentum sensor assembly includes a oscillable piezoelectric sensor 1. The detailed construction of the piezoelectric sensor 1 will be discussed later.

The piezoelectric sensor 1 is within a sensor casing which is composed of a lower casing component 2 and an upper casing component 3. Both the lower and upper casing components 2 and 3 are made of non-conductive synthetic resin, such as polyacetals or the like. The lower and upper casing components 2 and 3 have cylindrical circumferential wall sections 2a and 3a mating at free end edges thereof. An annular and cross-sectionally square clearance is defined between the mating edges of the lower and upper casing components 2 and 3 to receive therein an annular sensor support member 4. The sensor support member 4 is made of an elastic material, such as polyurethane resin. The sensor support member 4 engages with the edge of the oscillable piezoelectric sensor, 1 for oscillably supporting the latter within the internal space of the sensor casing.

The lower and upper casing components 2 and 3 are sealed and rigidly bonded or are welded in such a way that the enclosed internal space of the sensor casing is completely sealed.

A circuit board 5 on which various electric and/or electronic circuit components 6, such as a filter, an amplifier and so forth, are mounted. The circuit board 5 lies substantially parallel to the bottom 2b of the lower casing component 2 and is rigidly secured thereonto by means of fastening screws 5a. The circuit board 5 and the circuit components 6 are buried in a potting resin layer 7 which is filled after rigidly fastening the circuit board 5 onto the bottom 2b of the lower casing component 2.

The circuit board 5 is connected to an external circuit via a lead wire 8 which extends through a grommet 8a which is used as a seal and which is engaged on the outer periphery of the circumferential wall section 2a of the lower casing component 2.

The piezoelectric sensor 1 comprises a thin disc-shaped metal plate 10 which has a circumferential edge portion rigidly engaged with the sensor support member 4. A pair of piezoelectric elements 11 and 12 have a thin disc-shaped configuration with a diameter smaller than the diameter of the metal plate 10. The piezoelectric elements 11 and 12 are arranged concentrically with the metal plate 10 and are bonded or adhered on both sides of the metal plate 10 by epoxy resin or similar adhesive.

As clearly seen from FIGS. 2 and 3, since the piezoelectric elements 11 and 12 are smaller in diameter than metal plate 10, the circumferential edges of the piezoelectric elements 11 and 12 are placed away from the inner circumferential edge of the sensor support member 4. As a consequence, an annular portion of the metal plate 10, adjacent to the circumferential edge, is exposed.

The piezoelectric elements 11 and 12 are connected to the circuit board via lead wires 13 and 14 respectively. As is well known, since the piezoelectric elements 11 and 12 have a substantially high impedance, the length of the lead wires 13 and 14 will affect the kinetic momentum sensing ability by creating static electric capacities. This affect of the static electric capacities can be minimized by shortening length of the leads 13 and 14. In the shown embodiment, since the piezoelectric sensor 1 and the circuit board 5 are housed in the single sensor casing, with a substantially short distance therebetween, shortening of the lead wires 13 and 14 becomes possible.

In the preferred construction, the pair of piezoelectric elements 11 and 12 have mutually opposite output characteristics relative to variation of the temperature. Namely, since the piezoelectric elements 11 and 12 have temperature dependent variable output characteristics, the influence of variation of the output characteristics of the piezoelectric elements can be compensated by providing the opposite temperature dependent variation characteristics.

On the other hand, in order to avoid the influence of thermal expansion of the metal plate 10 and the piezoelectric elements 11 and 12, materials for the metal plate and the piezoelectric element will be selected so that the thermal expansion rates are as close as possible. In practice, when P.Z.T. is selected as a material for the piezoelectric elements 11 and 12, the material of the metal plate 10 may be selected among Ni.Fe alloys which have thermal expansion rates close to that of the piezoelectric elements 11 and 12. With this construction, the influence of the difference of the thermal expansion rates of the metal plate 10 and the piezoelectric elements 11 and 12 can be minimized.

On the other hand, the lead wires 13 and 14 are made of tin plated mild copper and are formed by aggregating a plurality of thin copper lines into a wire. The lead wires 13 and 14 are covered by a polyulethane cover layer. The lead wires 13 and 14 are fixed to piezoelectric elements 11 and 12, respectively by soldering. The joining portions between the lead wires 13 and 14 and the piezoelectric elements 11 and 12 are coated by an elastic shock absorbing material 15 and 17, such as polyulethane.

Furthermore, lead wires 13 and 14 are further secured to the annular bare portion of the metal plate 10 by elastic shock absorbing material 16 and 18. Similar to the shock absorbing materials 15 and 17, the elastic shock absorbing materials 16 and 18 are made of polyulethane, for example. Between the mutually associated elastic shock absorbing materials 15, 16 and 17, 18, extra length of the lead wires 13 and 14 are provided to provide sag.

The sensor support member 4 is formed of from an elastic synthetic resin, such as polyulethane resin. This sensor support member 4 is formed as a pre-assembly with the piezoelectric sensor 1. Namely, the piezoelectric sensor 1 is set in a molding for forming the sensor support member 4. After setting the piezoelectric sensor 1 in the molding, the molten material of the sensor support member is filled into the molding. The pre-assembly of the sensor support member 4 and the piezoelectric sensor 1 is removed from the molding after solidifying of the resin of the sensor support material.

The pre-assembly consisting of the sensor support member 4 and the piezoelectric sensor 1 is assembled with the lower and upper casing components 2 and 3 of the sensor casing by placing the sensor support member 4 within the annular space defined between the lower and upper casing components. After assembly, the sensor support member 4 may elastically supports the piezoelectric sensor relative to the sensor casing. The sensor support member 4 also serves as, sealing means for establishing an air- and/or liquid tight seal. Therefore, vapor in the atmospheric air and so forth will never enter into the internal space of the sensor casing. Vapor or moisture may otherwise cause leakage of the sensor voltage.

Therefore, in the shown construction, the overall circumferential edge of the generally disc-shaped piezoelectric sensor 1 is supported on the inner periphery of the sensor casing. This construction allows the piezoelectric sensor 1 to be oscillated in response to the kinetic energy exerted parallel to the axis of the sensor casing. Namely, the piezoelectric sensor 1 is not responsive to the kinetic energy laterally exerted in a direction substantially perpendicular to the axis of the sensor casing. On the other hand, when the kinetic energy is exerted in oblique relative to the axis of the sensor casing, the piezoelectric sensor 1 is responsive only to the axial component of the kinetic energy.

When the axial kinetic energy is exerted on the piezoelectric sensor 1, the sensor undergoes deformation and creates output voltages from the piezoelectric elements 11 and 12. The output voltages of the piezoelectric elements vary depending upon the magnitude of the kinetic energy exerted. The output voltages of the piezoelectric elements 11 and 12 are amplified and filtered by the circuit on the circuit board and then outputted, through the lead wire 8, as the kinetic momentum indicative sensor signal.

At this time, since the overall circumferential edge of the pre-assembly consisting of the piezoelectric sensor 1 and the sensor support member 4 is sealed and secured onto the inner periphery of the circumferential wall of the sensor casing, the enclosed internal space of the sensor casing is separated into two chambers. When both chambers are not in communication with each other, a pressure difference may be created by deformation of the piezoelectric sensor 1. This pressure difference serves as resistance against deformation of the piezoelectric sensor 1 and lowers the voltage to be created. This clearly degrades the precision of measurement of the kinetic momentum. Furthermore, this separated chamber tends to cause deformation of the piezoelectric sensor 1 when a temperature difference between the two chambers occurs. Namely, when a temperature difference occurs, pressures in the chambers become different and cause deformation of the piezoelectric sensor toward the chamber of lower pressure In order to avoid this problem, one or more small openings 19 are formed through the annular bare section of the metal plate 10. This through openings 19 establish communication between both chambers and thus serve for equalization of the pressures of the chambers.

As set forth, since the sensor casing is sealed and enclosed in a liquid-tight and air-tight fashion, entry of dust, moisture, corrosive gas and so forth is completely prevented. Therefore, as set forth above, leakage of the output voltage due to the presence of moisture is perfectly prevented. Since the piezoelectric sensor 1 of the shown embodiment of the kinetic momentum sensor is provided precise directionality in kinetic energy or momentum sensibility, kinetic energy or momentum in the direction different from a axial direction will not serve as a noise creating factor. This assures high precision of measurement of the kinetic momentum in the predetermined direction.

In addition, since no corrosive gas may enter into the internal space of the sensor casing, corrosion of the piezoelectric elements and/or the metal plate is successfully prevented. Also, since the bending stress to be exerted on the metal plate is evenly distributed over the overall circumferential edge, stress concentrations are avoided. Therefore, life of the piezoelectric sensor can be remarkably expanded long enough to employ in the automotive suspension control system, for example.

Figure 4:
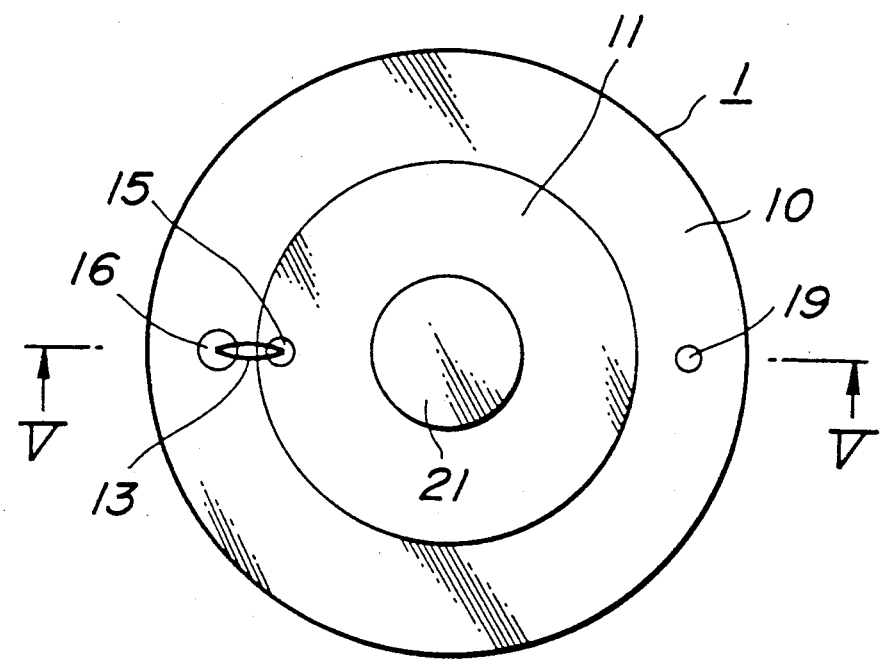
FIG. 4 is a plan view of a modified construction of the piezoelectric sensor to be employed in the piezoelectric kinetic momentum sensor assembly of FIG. 1.
Figure 5:
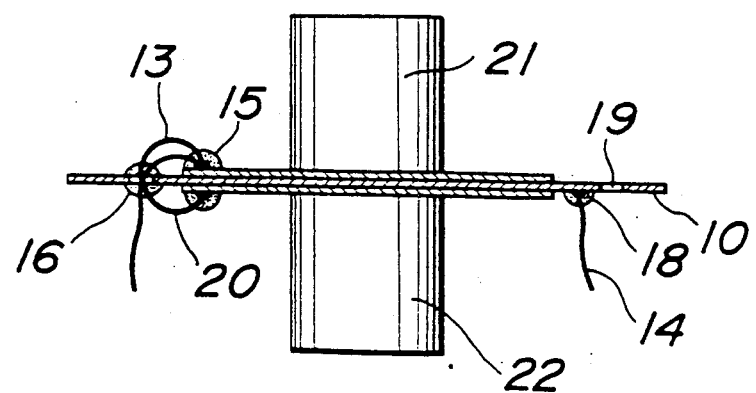
FIG. 5 is a section of the piezoelectric sensor taken along line V—V of FIG. 4.

FIGS. 4 and 5 show a modified construction of the piezoelectric kinetic momentum sensor which is specifically designed to be employed in the suspension control system of an automotive vehicle. This modification has a sensible frequency range of kinetic energy, i.e. vibration energy.

In order to specify the sensible frequency range, mass weight members 21 and 22 are fitted on the piezoelectric elements 11 and 12 of the piezoelectric sensor 1. These mass weight members 21 and 22 will serve a pre-load for the piezoelectric sensor. In addition, since the resonance frequency of the vibrating member is determined by the mass weight thereof, such mass weight members 21 and 22, which serve to increase the mass weight of the piezoelectric sensor, lower the resonance frequency of the piezoelectric sensor.

As set forth above, since the resonance frequency range of the piezoelectric sensor is variable depending upon the mass weight thereof, the resonance frequency range can be adjusted by adjusting the weight of the mass weight members 21 and 22.

By adjusting the resonance frequency range, the kinetic momentum sensor of the present invention may be applicable to monitoring relative displacement stroke and acceleration of the vehicle body and the wheel axle in an automotive suspension system.

As will be appreciated herefrom, the present invention fulfills all of the objects and advantages sought therefor.

What is claimed is:

1. A piezoelectric sensor for monitoring the kinetic momentum of a movable member, comprising:
   a sensor casing defining a sealed internal space therein;
   a piezoelectric sensor assembly composed of a flexible plate member having at least one plane surface and a piezoelectric element fitted onto said plane surface of said flexible plate member;
   a sensor support member secured onto the inner periphery of a circumferential wall of said sensor casing and engaging the entire circumferential edge of said piezoelectric sensor assembly so as to oscillably support the latter within said enclosed internal space of said sensor casing; and
   said sensor support member being made of an elastic material so as to increase the active area of the piezoelectric sensor assembly, thereby increasing its sensitivity and compliance.

2. A piezoelectric sensor as set forth in claim 1, wherein said sensor support member is made of an elastically deformable resin material.

3. A piezoelectric sensor as set forth in claim 1, wherein said flexible plate member is made of a material which has a thermal expansion rate approximately equal to the thermal expansion rate of said piezoelectric element.

4. A piezoelectric sensor as set forth in claim 3, which further comprises means for equalizing the pressure in chambers defined in said internal space of said sensor casing and separated by said piezoelectric sensor assembly.

5. A piezoelectric sensor as set forth in claim 4, wherein said pressure equalizing means comprises a through opening formed through said flexible plate member.

6. A piezoelectric sensor as set forth in claim 5, wherein said flexible plate member is made of an electrically conductive metal plate.

7. A piezoelectric sensor as set forth in claim 1, wherein said sensor casing also contains a sensor circuit assembly within said enclosed internal space and adjacent to said piezoelectric sensor assembly.

8. A piezoelectric sensor as set forth in claim 7, wherein said sensor circuit assembly is located so as to be close enough to said piezoelectric sensor assembly so that said piezoelectric element of said piezoelectric sensor assembly can be connected to said sensor circuit by means of a substantially short lead wire.

9. A piezoelectric sensor as set forth in claim 8, wherein said sensor circuit assembly comprises a circuit board and a plurality of sensor circuit components including an amplifier element and a filter elements, and is buried by a potting material.

10. A piezoelectric sensor responsive to movement of a movable member, comprising:
    a sensor casing defining a sealed internal space therein and formed with at least two components;
    a piezoelectric sensor assembly composed of a disc-shaped flexible plate member having a pair of plane surfaces and a pair of disc-shaped piezoelectric elements fitted onto said pair of plane surfaces;
    a sensor support member secured onto the inner periphery of a circumferential wall of said sensor casing and engaging the entire circumferential edge of said piezoelectric sensor assembly so as to oscillably support the latter within said enclosed internal space of said sensor casing; and
    said sensor support member being made of an elastic material and said disc-shaped flexible plate formed as a diaphragm spring so as to increase the active area of the piezoelectric sensor assembly, whereby its sensitivity and compliance are increased.

11. A piezoelectric sensor as set forth in claim 10, wherein said first and second components are formed into a bottomed cylindrical configuration to define said enclosed internal space of circular cross-section, and said flexible plate member and said piezoelectric elements are formed into disc-shaped configurations, said flexible plate member having a diameter essentially conforming to or slightly greater than the internal diameter of said circular internal space of said sensor casing.

12. A piezoelectric sensor as set forth in claim 11, wherein, said, first and second components of said sensor casing define a recess for receiving said sensor support member on the inner periphery.

13. A piezoelectric sensor as set forth in claim 12, wherein said sensor support member is made of an elastically deformable resin material.

14. A piezoelectric sensor as set forth in claim 13, wherein said flexible plate member is made of a material which has a thermal expansion rate approximately equal to the thermal expansion rate of said piezoelectric element.

15. A piezoelectric sensor as set forth in claim 14, which further comprises means for equalizing the pressure in chambers defined between the said internal space of said sensor casing and separated by said piezoelectric sensor assembly.

16. A piezoelectric sensor as set forth in claim 15, wherein said pressure equalizing means comprises a through opening formed through said flexible plate member.

17. A piezoelectric sensor as set forth in claim 16, wherein said flexible plate member is made of an electrically conductive metal plate.

18. A piezoelectric sensor as set forth in claim 10, wherein said sensor casing also contains a sensor circuit assembly within said enclosed internal space and adjacent to said piezoelectric sensor assembly.

19. A piezoelectric sensor as set forth in claim 18, wherein said sensor circuit assembly is located so as to be close enough to said piezoelectric sensor assembly so that said piezoelectric element of said piezoelectric sensor assembly can be connected to said sensor circuit by means of a substantially short lead wire.

20. A piezoelectric sensor as set forth in claim 19, wherein said sensor circuit assembly comprises a circuit board and a plurality of sensor circuit components including an amplifier element and a filter element and is buried by a potting material.

21. A piezoelectric accelerometer for monitoring acceleration responsive to movement of a vibrating member, comprising:
   a sensor casing including separately formed first and second components which have circumferential edge sections, in which first and second components are made of insulating material and are assembled to each other with sealed and secured mating edges, said sensor casing defining a sealed internal space;
   a piezoelectric sensor assembly composed of a disc-shaped flexible plate member, made of an electrically conductive material and having a pair of plane surfaces and a pair of disc-shaped piezoelectric elements fitted onto said pair of plane surfaces;
   means for equalizing the pressure in the chambers defined in said internal space of said sensor casing and separated by said piezoelectric sensor assembly;
   a sensor support member made of an elastic material and secured onto the inner periphery of a circumferential wall of said sensor casing and engaging the entire circumferential edge of said piezoelectric sensor assembly so as to oscillably support the latter within said enclosed internal space of said sensor casing; and
   said sensor support member being made of an elastic material and said disc-shaped flexible plate formed as a diaphragm spring so as to increase the active area of the piezoelectric sensor assembly whereby its sensitivity and compliance are increased.

22. A piezoelectric accelerometer as set forth in claim 21, wherein, said first and second components of said sensor casing define a recess for receiving said sensor support member on the inner periphery.

23. A piezoelectric accelerometer as set forth in claim 22, wherein said flexible plate member is made of a material which has a thermal expansion rate approximately equal to the thermal expansion rate of said piezoelectric element.

24. A piezoelectric acclerometer as set forth in claim 23, wherein said pressure equalizing means comprises a through opening formed through said flexible plate member.

25. A piezoelectric accelerometer as set forth in claim 23, wherein said sensor casing also contains a sensor circuit assembly within said enclosed internal space and adjacent to said piezoelectric sensor assembly.

26. A piezoelectric accelerometer as set forth in claim 25, wherein said sensor circuit assembly is as to be close enough to said piezoelectric sensor assembly so that said piezoelectric element of said piezoelectric sensor assembly can be connected to said sensor circuit by means of a substantially short lead wire.

27. A piezoelectric accelerometer as set forth in claim 26, wherein said sensor circuit assembly comprises a circuit board and a plurality of sensor circuit components including an amplifier element and a filter element, and is buried by a potting material.

* * * * *